United States Patent  [19]
Chang et al.

(10) Patent No.: US 6,677,199 B1
(45) Date of Patent: Jan. 13, 2004

(54) STRUCTURE FOR PREVENTING SALICIDE BRIDGING AND METHOD THEREOF

(75) Inventors: Tsai-Fu Chang, Taichung (TW); Shih Lin Chu, Kaohsiung (TW); Ching Pen Yeh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/186,619

(22) Filed: Jul. 2, 2002

(51) Int. Cl.[7] ............................................. H01L 21/336

(52) U.S. Cl. ........................ 438/257; 438/926; 365/149

(58) Field of Search .................................. 438/257, 314, 438/324, 326, 926, 925; 365/149, 189, 205, 207, 210, 208

(56) References Cited

U.S. PATENT DOCUMENTS

| 4,748,596 | A | * | 5/1988 | Ogura et al. |
| 5,001,669 | A | * | 3/1991 | Cho et al. |
| 5,448,516 | A | * | 9/1995 | Tsukikawa et al. |

* cited by examiner

Primary Examiner—Phuc T. Dang
(74) Attorney, Agent, or Firm—Finnegan, Henderson, Farabow, Garrett & Dunner, L.L.P.

(57) ABSTRACT

A semiconductor device having a memory array that includes a plurality of substantially parallel word lines, a plurality of substantially parallel bit lines, wherein each of the plurality of the word lines is substantially perpendicular to each of the plurality of the bit lines, a first dummy word line disposed at a periphery of the memory array, wherein the first dummy word line is substantially parallel to the plurality of word lines and overlaps at least two non-adjacent bit lines.

7 Claims, 4 Drawing Sheets

STRUCTURE FOR PREVENTING SALICIDE BRIDGING AND METHOD THEREOF

FIELD OF THE INVENTION

This invention pertains in general to a semiconductor device and, more particularly, to a structure for preventing salicide bridging in a semiconductor device and a method thereof.

BACKGROUND OF THE INVENTION

In modem memory integrated circuits ("ICs"), an important consideration is the speed that stored data may be read or retrieved. Such speed depends partly on the speed of word lines. In the semiconductor industry's continued effort to reduce feature sizes of ICs, the width of word lines is also reduced. Such a reduction leads to an increase in the resistance of the word lines. As is known, higher resistance on a word line reduces its speed, which, in turn, reduces the speed of the memory IC. In order to fabricate high performance ICs, low resistivity on the word line is therefore critical.

In conventional metal-oxide semiconductor ("MOS") ICs, polysilicon is often used as the gate material. The conductivity of polysilicon is increased by doping, but even when doped at a high concentration, the resistance of doped polysilicon remains high. The resistivity of polysilicon may be further decreased by depositing a layer of metal, such as Ti, over the polysilicon. In the case of a transistor, the metal layer is deposited over the gate structure after the transistor is formed. Only the portion of the metal layer deposited over the polysilicon layer will react with the polysilicon to form silicides. The process for forming suicides is therefore "self-aligned" and is referred to as the salicide process. Through the formation of a suicide layer over a polysilicon gate, the resulting "polycide" has a significantly lower resistivity.

The salicide process has been used in the manufacture of memory ICs. A memory IC generally includes a memory array having a matrix of memory cells, or transistors, together with a plurality of substantially parallel word lines, and a plurality of substantially parallel bit lines. Each of the word lines is substantially perpendicular to each of the bit lines. Each word line generally represents the gates of the transistors in a single row of the memory array, and each bit line generally represents the source or drain regions of the transistors in a single column of the memory array. FIG. 1 shows a layout of word lines 12 and bit lines 14 in a conventional IC 10. Because the source and drain regions are diffused regions formed in the IC substrate, bit lines are also known as "buried" bit lines.

An IC that incorporates the memory array component of a memory IC and logic components are known as embedded products. From the manufacturing point of view, the only difference between a logic component and a memory component is that a memory component, i.e., memory cell, requires an additional polysilicon layer. Therefore, to decrease the manufacturing cost of an embedded product, logic components and memory components are formed near simultaneously. During the manufacturing process, the memory components may be masked while certain aspects of the logic components are being manufactured, and vice versa. However, a possible result is that salicides may be unintentionally formed over some active regions that cannot be masked, such as the source and/or drain regions, during a particular step of the manufacturing process. This is known as salicide bridging. Slicide bridging is undesirable because it may render an IC inoperative. Two types of salicide bridging may occur in a memory array.

FIG. 2 shows a cross-sectional view of device 10 shown in FIG. 1 along the periphery, or A–A' direction, of the device array (not numbered). Referring to FIG. 2, a layer of salicide 18 is formed over a substrate 16 of device 10 and electrically connects two of the non-consecutive or non-adjacent bit lines 14-1 and 14-2. Bit lines 14-1 and 14-2 extend through the array more than the other bit lines. As indicated in FIG. 2, an electrical short is created between two bit lines 14-1 and 14-2, which are n-type diffused regions.

A second type of salicide bridging is shown in FIG. 3. FIG. 3 is a cross-sectional view of device 10 shown in FIG. 1 along the center portion, or B–B' direction, of the device array. Referring to FIG. 3, salicide 18 is formed over substrate 16, connecting a number of bit lines 14. As indicated in FIG. 3, electrical shorts are created between and among bit lines 14.

SUMMARY OF THE INVENTION

In accordance with the invention, there is provided a semiconductor device having a memory array that includes a plurality of substantially parallel word lines, a plurality of substantially parallel bit lines, wherein each of the plurality of the word lines is substantially perpendicular to each of the plurality of the bit lines, a first dummy word line disposed at a periphery of the memory array, wherein the first dummy word line is substantially parallel to the plurality of word lines and overlaps at least two non-adjacent bit lines.

Also in accordance with the present invention, there is provided a semiconductor device that includes a memory array comprising a plurality of transistors, and a plurality of non-memory transistors, wherein the memory array includes a plurality of substantially parallel word lines, a plurality of substantially parallel bit lines, each of the plurality of the word lines being substantially perpendicular to each of the plurality of the bit lines, and a first dummy word line disposed at a periphery of the memory array, wherein the first dummy word line is substantially parallel to the plurality of word lines and overlaps at least one of the plurality of bit lines.

In accordance with the present invention, there is also provided a method for manufacturing a semiconductor device that includes forming a plurality of substantially parallel bit lines, forming a plurality of substantially parallel word lines, wherein each of the plurality of the word lines is substantially perpendicular to each of the plurality of the bit lines, depositing a layer of tetraethyl orthosilicate over the plurality of bit lines and plurality of word lines, wherein the amount of tetraethyl orthosilicate deposited on top of the plurality of word line having a thickness greater than half the distance separate adjacent word lines, and etching back the tetraethyl orthosilicate layer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 4:
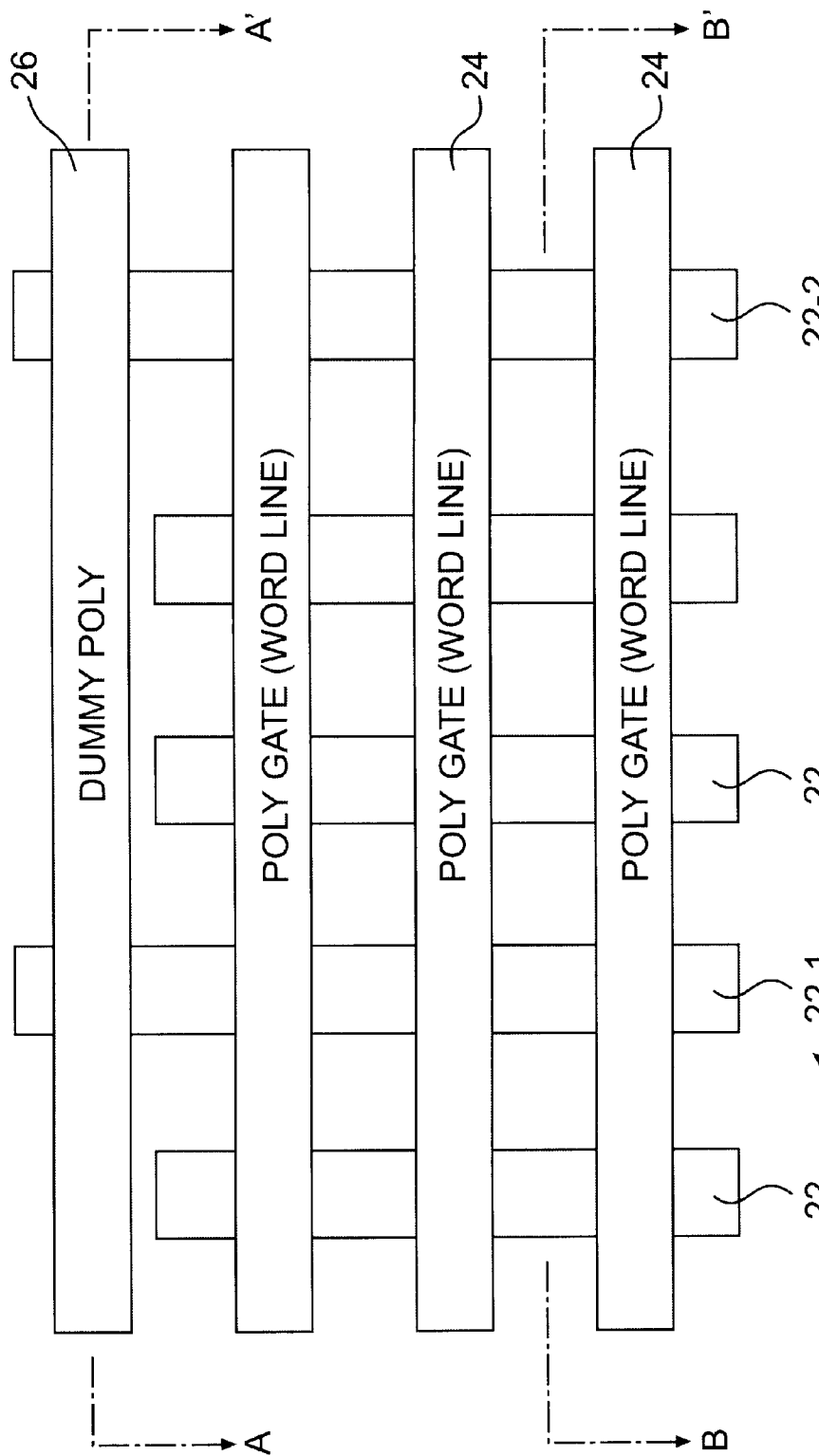
FIG. 4 is a layout of a semiconductor device consistent with one embodiment of the present invention.

FIG. 4 shows a layout of a semiconductor device 20 consistent with one embodiment of the present invention. Referring to FIG. 4, device 20 includes a plurality of substantially parallel word lines 24 and a plurality of substantially parallel bit lines 22. Each of the plurality of word lines 24 is substantially perpendicular to each of the plurality of bit lines 22. Word lines 24 are polysilicon gates of the transistors in the memory array (not numbered) in device 20 and are also referred to as "poly gates." In addition, device 20 includes a "dummy poly," or dummy word line 26 disposed at the periphery of the array, overlapping two of non-adjacent adjacent bit lines 22-1 and 22-2. As the name indicates, dummy word line 26 is a layer of polysilicon disposed over the device substrate (not shown), and generally not electrically connected to any voltage or current source. Dummy word line 26 usually does not provide any function relating to the operation of device 20 as do the other word lines, but a voltage source may be coupled to dummy word line 26 when required for specific applications.

Figure 1:
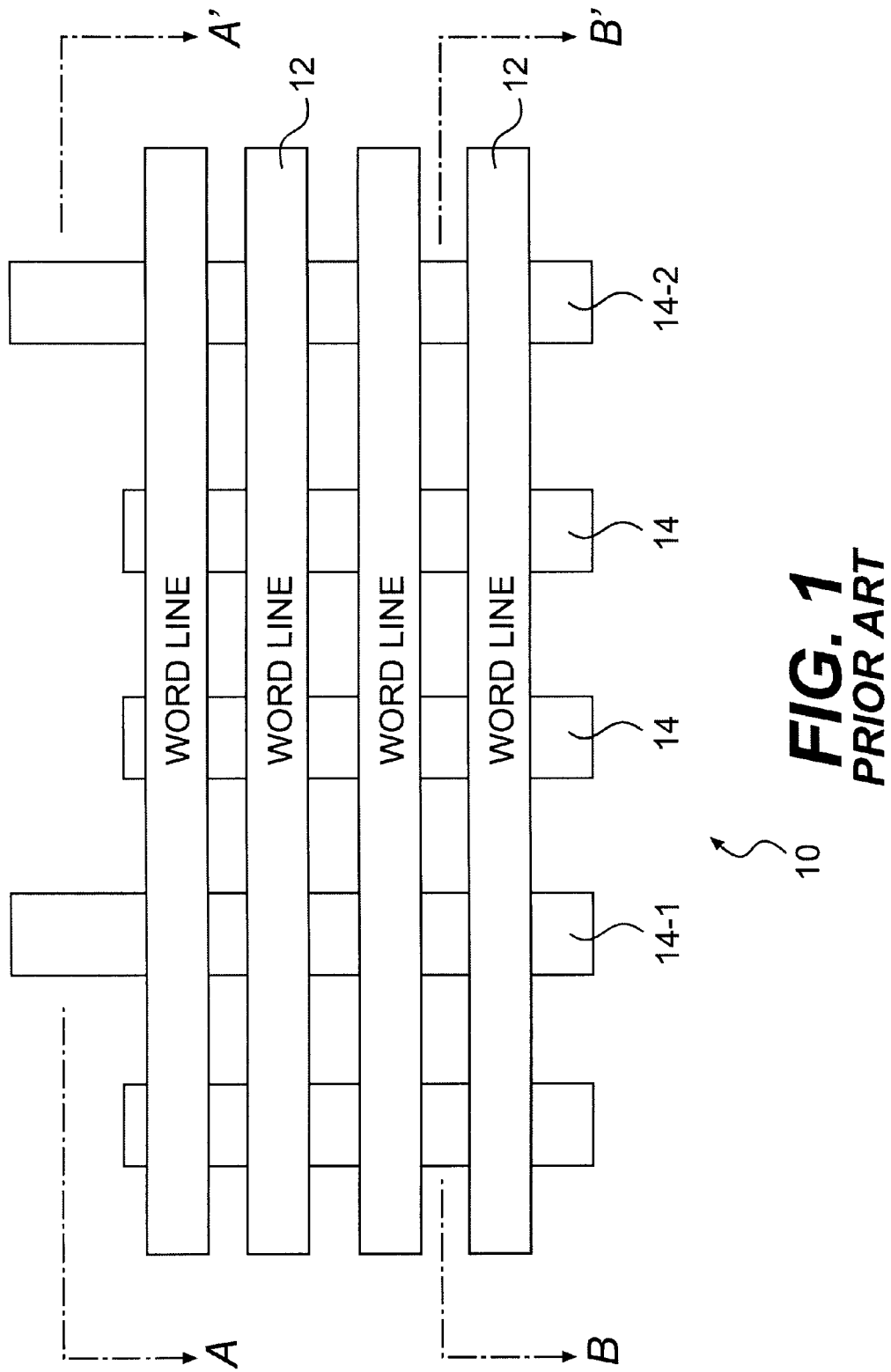
FIG. 1 is a layout of a conventional semiconductor device.
Figure 2:
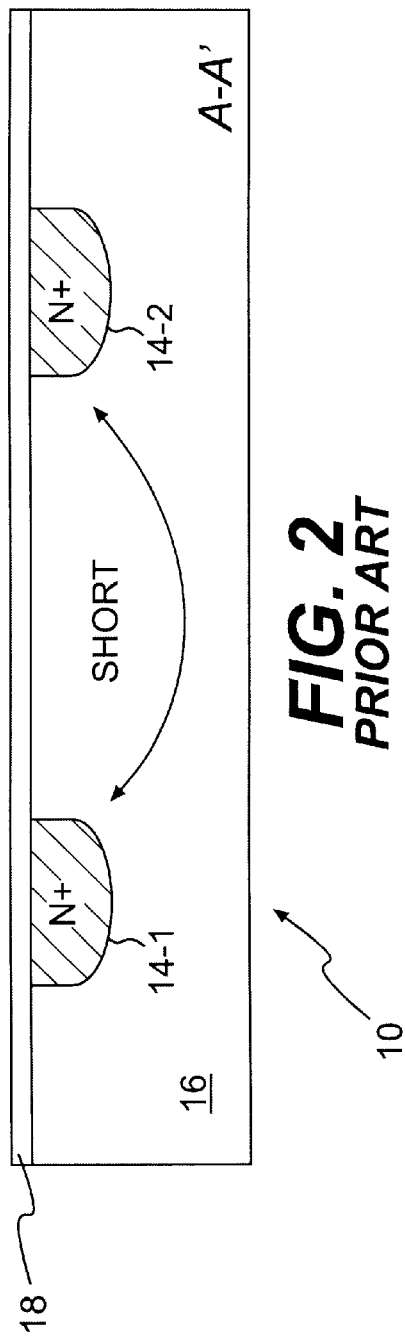
FIG. 2 is a cross-sectional view of the semiconductor device shown in FIG. 1 along the A–A' direction.

During the manufacturing process of device 20, dummy word line 26 is formed at the same time as the other word lines in the array. The salicide process then follows. Dummy word line 26 serves to prevent the silicides from being formed between non-adjacent word lines 22-1 and 22-2. Dummy word line 26 therefore prevents salicide bridging between two non-adjacent word lines 22-1 and 22-2, as depicted in FIG. 2 of the prior art device.

Figure 5:
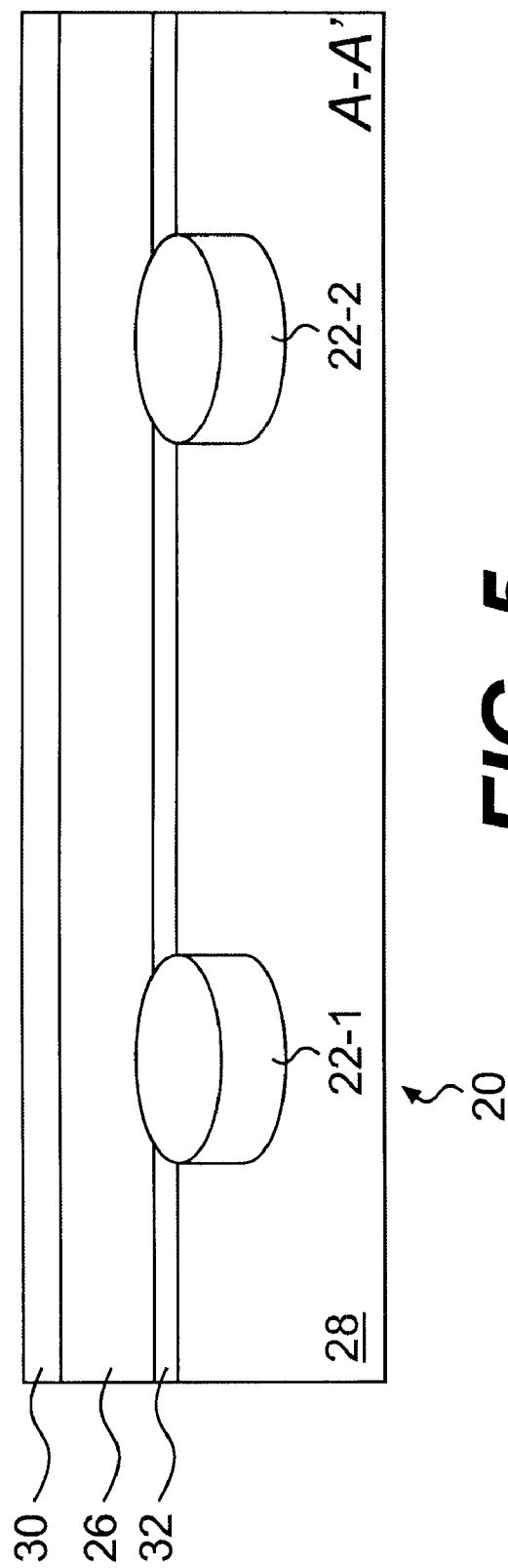
FIG. 5 is a cross-sectional view of the semiconductor device shown in FIG. 4 along the A–A' direction.

FIG. 5 is a cross-sectional view of device 20 shown in FIG. 4 along the A–A' direction. Referring to FIG. 5, an oxide layer 32 may be formed over the device substrate 28 and non-adjacent word lines 22-1 and 22-2. Dummy word line 26 is disposed over oxide layer 32. A layer of salicide 30 is formed over dummy word line 26. Therefore, dummy word line 26 separates salicide layer 30 from the active regions, or bit lines 22-1 and 22-2, of device 20. Non-adjacent bit lines 22-1 and 22-2 are diffused regions, and may comprise the source and/or drain regions of non-adjacent transistors in the memory array. For purposes of describing the present invention, diffused regions 22-1 and 22-2 are n-type diffused regions. One skilled in the art will recognize that the type of diffused region is unimportant for purposes of the present invention.

Although only one dummy word line is shown in FIG. 4, the embodiments of the present invention may include a plurality of dummy word lines. A dummy word line may be formed in any area of the array where salicide bridging may occur. In one embodiment, two dummy word lines are formed, each at one opposing end of the periphery of the array. In addition, a dummy word line does not need to extend through the entire length or width of the array, so long as the dummy word line prevents undesired silicides from electrically connecting two active regions. In another embodiment, the dummy word line only overlaps one bit line.

Figure 3:
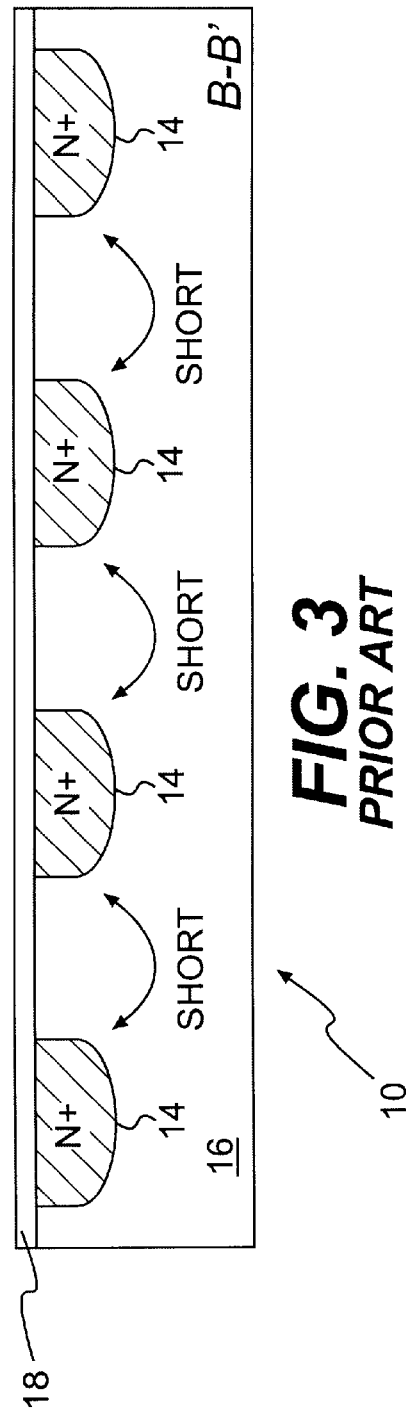
FIG. 3 is a cross-sectional view of the semiconductor device shown in FIG. 1 along the B–B' direction.

To prevent the type of salicide bridging shown in FIG. 3, i.e., salicide bridging between consecutive or neighboring bit lines, an embodiment of the present invention provides a layer of tetraethyl orthosilicate ("TEOS") over the array before the salicide process. To manufacture a semiconductor device having both logic and memory components, conventional CMOS manufacturing process may be followed to form logic components and at least one memory array comprising a plurality of memory cells, a plurality of substantially parallel bit lines, and a plurality of substantially parallel word lines, wherein the bit lines are substantially perpendicular to the word lines. After the word lines, or transistor gates have been deposited, patterned and formed, a layer of TEOS is deposited over the memory array. Any exposed source and drain regions of the transistors, including the bit lines, are covered with the conformal dielectric material. To ensure that no source or drain region is exposed during the salicide process, the TEOS thickness T deposited on top of the polysilicon gates, or word lines, should be greater than ½ the width S separating adjacent polysilicon gates or word lines. The relationship may be expressed as $S<2T$. Therefore, after the layer of TEOS is deposited and etched back, the active regions of the source and drain regions are covered with the dielectric material, thereby eliminating salicide bridging between neighboring bit lines.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device having a memory array defined by a length and a width, comprising:
    a plurality of substantially parallel word lines;
    a plurality of substantially parallel bit lines, wherein each of the plurality of the word lines is substantially perpendicular to each of the plurality of the bit lines;
    a first dummy word line disposed at a periphery of the memory array, wherein the first dummy word line is substantially parallel to the plurality of word lines and overlaps at least two non-adjacent bit lines, and wherein the first dummy word line extends less than the entire length or width of the memory array.

2. The device as claimed in claim 1, wherein the first dummy word line comprises polysilicon.

3. A semiconductor device having a memory array, comprising:
    a plurality of substantially parallel word lines;
    a plurality of substantially parallel bit lines, wherein each of the plurality of the word lines is substantially perpendicular to each of the plurality of the bit lines;
    a first dummy word line disposed at a periphery of the memory array, wherein the first dummy word line is substantially parallel to the plurality of word lines and overlaps at least two non-adjacent bit lines; and a second dummy word line substantially parallel to the first dummy word line, wherein the second dummy word line is disposed at a periphery of the memory array opposite from the first dummy word line.

4. The device as claimed in claim 3, wherein the second dummy word line overlaps at least one bit line.

5. The device as claimed in claim 4, wherein the second dummy word line overlaps at least two non-adjacent bit lines.

6. A semiconductor device having a memory array, comprising:

a semiconductor substrate;

a plurality of substantially parallel bit lines formed in the substrate;

a plurality of substantially parallel word lines formed over the substrate, wherein each of the plurality of the word lines is substantially perpendicular to each of the plurality of the bit lines; and a layer of dielectric material over the substrate, wherein the layer of dielectric material covers exposed bit lines between adjacent word lines.

7. The device as claimed in claim 6, wherein the dielectric material comprises tetraethyl orthosilicate (TEOS).

* * * * *